United States Patent
Lee et al.

(10) Patent No.: US 9,331,181 B2
(45) Date of Patent: May 3, 2016

(54) NANODOT ENHANCED HYBRID FLOATING GATE FOR NON-VOLATILE MEMORY DEVICES

(71) Applicant: SanDisk Technologies, Inc., Plano, TX (US)

(72) Inventors: Donovan Lee, Santa Clara, CA (US);
James K. Kai, Santa Clara, CA (US);
George Samachisa, San Jose, CA (US);
Henry Chien, San Jose, CA (US);
George Matamis, Danville, CA (US);
Vinod R. Purayath, Santa Clara, CA (US)

(73) Assignee: SANDISK TECHNOLOGIES INC., Milpitas, CA (US)

( * ) Notice: Subject to any disclaimer, the term of this patent is extended or adjusted under 35 U.S.C. 154(b) by 406 days.

(21) Appl. No.: 13/792,662

(22) Filed: Mar. 11, 2013

(65) Prior Publication Data

US 2014/0252447 A1  Sep. 11, 2014

(51) Int. Cl.
*H01L 29/423* (2006.01)
*H01L 29/66* (2006.01)
*H01L 21/28* (2006.01)
(Continued)

(52) U.S. Cl.
CPC .... *H01L 29/66825* (2013.01); *H01L 21/28273* (2013.01); *H01L 29/42324* (2013.01); *H01L 29/42328* (2013.01); *H01L 29/42332* (2013.01); *H01L 29/7881* (2013.01); *H01L 29/7887* (2013.01); *B82Y 40/00* (2013.01)

(58) Field of Classification Search
CPC ............... H01L 29/42332; H01L 29/7881; H01L 29/66825; H01L 21/28282; H01L 27/11521; H01L 29/42348; H01L 27/115; H01L 29/66833; H01L 29/7887; H01L 29/792; H01L 27/11524; H01L 29/42324; H01L 29/42328; H01L 29/788; H01L 29/7883
See application file for complete search history.

(56) References Cited

U.S. PATENT DOCUMENTS

| | | |
|---|---|---|
| 5,012,446 A | 4/1991 | Bergemont |
| 5,570,315 A | 10/1996 | Tanaka et al. |

(Continued)

FOREIGN PATENT DOCUMENTS

| | | |
|---|---|---|
| DE | 10 2008 009365 A1 | 10/2008 |
| EP | 2 068 351 A1 | 6/2009 |
| JP | H7-086438 | 3/1995 |

OTHER PUBLICATIONS

Invitation to Pay Addition Fees with partial European Search Report received in connection with international application No. PCT/US2014/017955; mailed May 14, 2014.

(Continued)

*Primary Examiner* — Evan Pert
*Assistant Examiner* — Leslie Pilar Cruz
(74) *Attorney, Agent, or Firm* — The Marbury Law Group PLLC

(57) ABSTRACT

A memory device and a method of making a memory device that includes a semiconductor channel, a tunnel dielectric layer located over the semiconductor channel, a floating gate located over the tunnel dielectric layer, the floating gate comprising a continuous layer of an electrically conductive material and at least one protrusion of an electrically conductive material facing the tunnel dielectric layer and electrically shorted to the continuous layer, a blocking dielectric region located over the floating gate, and a control gate located over the blocking dielectric layer.

10 Claims, 9 Drawing Sheets

(51) Int. Cl.
*H01L 29/788* (2006.01)
*B82Y 40/00* (2011.01)

(56) References Cited

U.S. PATENT DOCUMENTS

| | | | |
|---|---|---|---|
| 5,774,397 | A | 6/1998 | Endoh et al. |
| 6,015,738 | A | 1/2000 | Levy et al. |
| 6,046,935 | A | 4/2000 | Takeuchi et al. |
| 6,069,040 | A | 5/2000 | Miles et al. |
| 6,294,429 | B1 | 9/2001 | Lam et al. |
| 6,407,424 | B2 | 6/2002 | Forbes |
| 6,646,302 | B2 | 11/2003 | Kan et al. |
| 6,656,792 | B2 | 12/2003 | Choi et al. |
| 6,723,606 | B2 | 4/2004 | Flagan et al. |
| 6,859,397 | B2 | 2/2005 | Lutze et al. |
| 6,881,994 | B2 | 4/2005 | Lee et al. |
| 6,913,984 | B2 | 7/2005 | Kim et al. |
| 6,917,542 | B2 | 7/2005 | Chen et al. |
| 6,927,136 | B2 | 8/2005 | Lung et al. |
| 6,991,984 | B2 | 1/2006 | Ingersoll et al. |
| 7,045,851 | B2 | 5/2006 | Black et al. |
| 7,119,395 | B2 | 10/2006 | Gutsche et al. |
| 7,138,680 | B2 | 11/2006 | Li et al. |
| 7,173,304 | B2 | 2/2007 | Weimer et al. |
| 7,259,984 | B2 | 8/2007 | Kan et al. |
| 7,649,779 | B2 | 1/2010 | Ruttkowski et al. |
| 7,723,186 | B2 | 5/2010 | Purayath et al. |
| 8,193,055 | B1 | 6/2012 | Purayath et al. |
| 2004/0026682 | A1 | 2/2004 | Jiang |
| 2004/0130941 | A1 | 7/2004 | Kan et al. |
| 2004/0180491 | A1 | 9/2004 | Arai et al. |
| 2004/0256662 | A1 | 12/2004 | Black et al. |
| 2005/0112820 | A1 | 5/2005 | Chen et al. |
| 2005/0122775 | A1* | 6/2005 | Koyanagi et al. ........ 365/185.11 |
| 2005/0161731 | A1* | 7/2005 | Ingersoll et al. .............. 257/325 |
| 2005/0258470 | A1 | 11/2005 | Lojek et al. |
| 2005/0287717 | A1 | 12/2005 | Heald et al. |
| 2006/0170033 | A1* | 8/2006 | Lee et al. ...................... 257/324 |
| 2006/0250836 | A1 | 11/2006 | Herner et al. |
| 2006/0250837 | A1 | 11/2006 | Herner et al. |
| 2007/0045604 | A1 | 3/2007 | Liu et al. |
| 2007/0158736 | A1 | 7/2007 | Arai et al. |
| 2008/0242011 | A1 | 10/2008 | Song et al. |
| 2009/0001345 | A1 | 1/2009 | Schricker et al. |
| 2009/0014704 | A1 | 1/2009 | Chen et al. |
| 2009/0027944 | A1 | 1/2009 | Ufert |
| 2009/0097320 | A1 | 4/2009 | Min et al. |
| 2009/0117697 | A1 | 5/2009 | Park et al. |
| 2009/0146140 | A1 | 6/2009 | Kim et al. |
| 2009/0168491 | A1 | 7/2009 | Schricker et al. |
| 2010/0008128 | A1 | 1/2010 | Yoshii et al. |
| 2011/0020992 | A1 | 1/2011 | Purayath et al. |
| 2011/0186799 | A1 | 8/2011 | Kai et al. |

OTHER PUBLICATIONS

International Search Report and Written Opinion received in connection with international application No. PCT/US2014/017955; mailed Aug. 8, 2014.
Partial International Search Report, International Application No. PCT/US2011/023617, May 24, 2011.
International Preliminary Report on Patentability, International Application No. PCT/US2011/023617, Aug. 16, 2012.
International Search Report & Written Opinion, International Application No. PCT/US2011/023617, Jul. 13, 2011.
Chen et al., "Reliability Characteristics of NiSi Nanocrystals Embedded in Oxide and Nitride Layers for Nonvolatile Memory Application," Applied Physics Letters, 92, 152114 (2008).
Jang et al., "Memory Properties of Nickel Silicide Nanocrystal Layer for Possible Application to Nonvolatile Memory Devices," IEEE Transactions on Electron Devices, vol. 56, No. 12, Dec. 2009.
Komatsu et al., "Applying Nanotechnology to Electronics," Science & Technology Trends, Quarterly Review No. 16, Jul. 2005.
Guarini et al., "Low Voltage, Scalable Nanocrystal Flash Memory Fabricated by Templated Self-Assembly," IEEE Int. Electron Devices Meeting Tech. Diges, vol. 22, No. 2, Dec. 2003.
Miura et al., "Non-Volatile Flash Memory with Discrete Bionanodot Floating Gate Assembled by Protein Template," Nanotechnology, Jun. 25, 2008, 19(25), Abstract.
U.S. Appl. No. 13/708,677, V. Purayath et al., "Non-Volatile Memory Structure Containing Nanodots and Continuous Metal Layer Charge Traps and Method of Making Thereof," Specification and drawings, filed Dec. 7, 2012.
U.S. Appl. No. 13/690,054, V. Purayath et al., "Select Gate Formation for Nanodot Flat Cell," Specification and drawings, filed Nov. 30, 2012.
U.S. Appl. No. 13/708,587, V. Purayath et al., "NAND Memory Device Containing Nanodots and Method of Making Thereof," Specification and drawings, filed Dec. 7, 2012.
U.S. Appl. No. 13/781,066, Donovan Lee et al., "Method for Using Nanoparticles to Make Uniform Discrete Floating Gate Layer," Specification and drawings, filed Feb. 28, 2013.
International Preliminary Report on Patentability issued in PCT Application No. PCT/US2011/023617, mailed on Aug. 16, 2012.
International Search Report and Written Opinion issued in PCT Application PCT/US2011/023617, mailed on Jul. 13, 2011.
Partial International Search Report issued in PCT Application No. PCT/US2011/023617; mailed on May 24, 2011.
Chan et al., "A True Single-Transistor Oxide-Nitride-Oxide EEPROM Device," IEEE Electron Device Letters, vol. EDL-8, No. 3, Mar. 1987, pp. 93-95.
Nozaki et al., "A 1-MB EEPROM with MONOS Memory Cell for Semiconductor Disk Application," EEE Journal of Solid-State Circuits, vol. 26, No. 4, Apr. 1991, pp. 497-501.

* cited by examiner

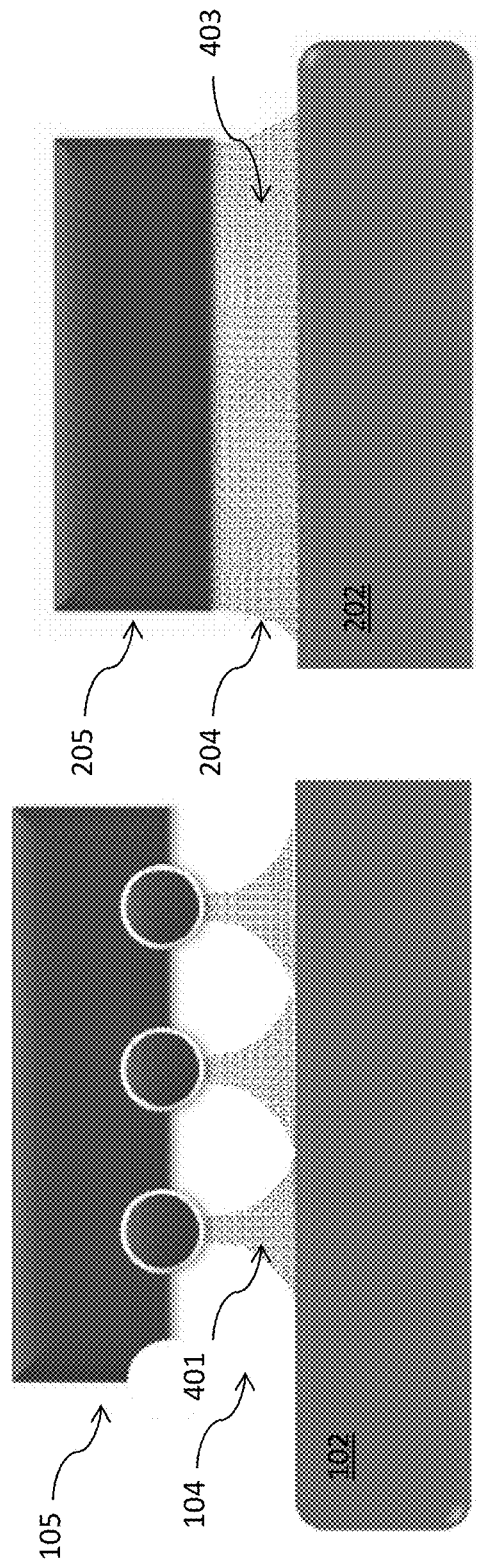

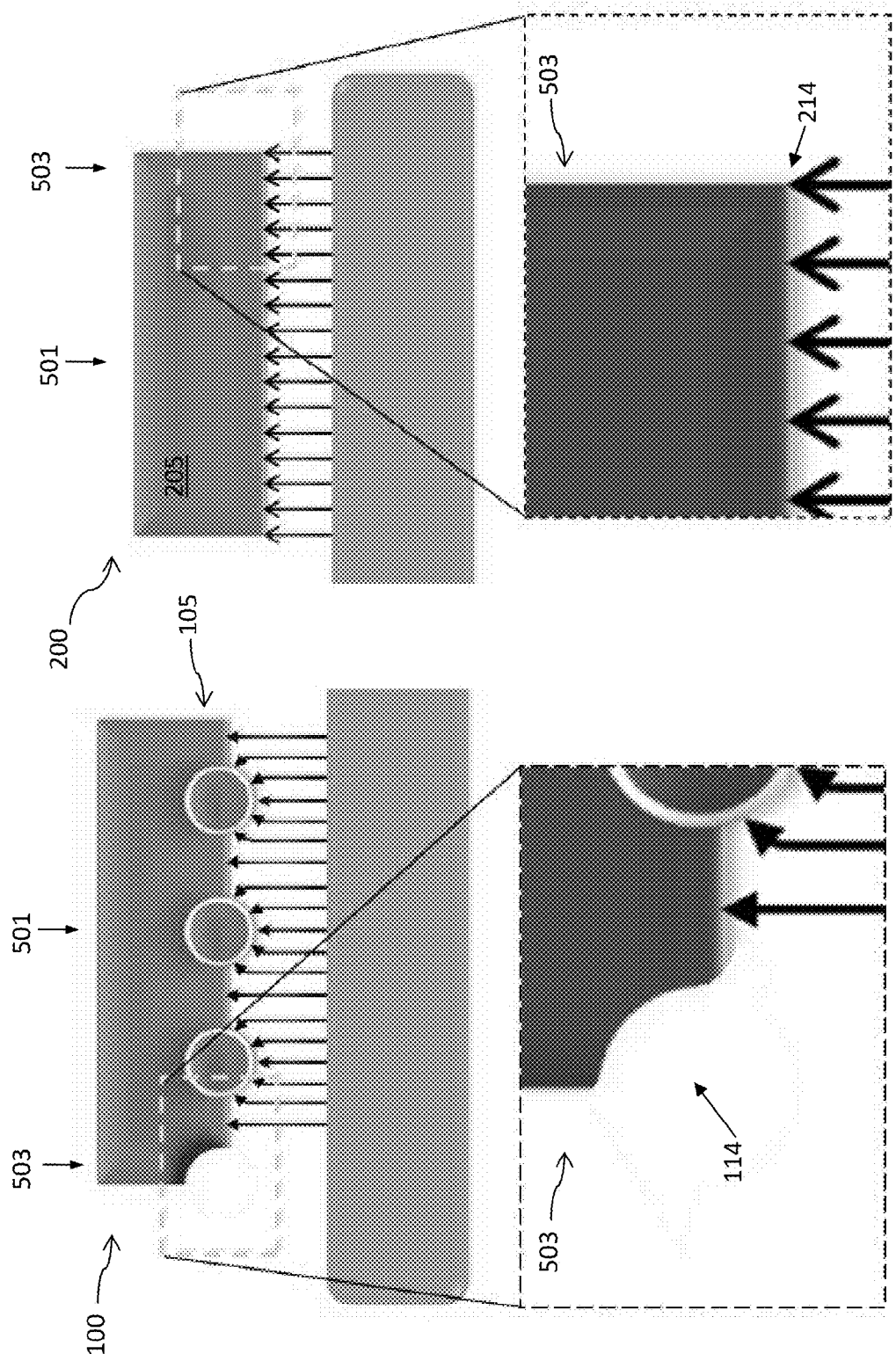

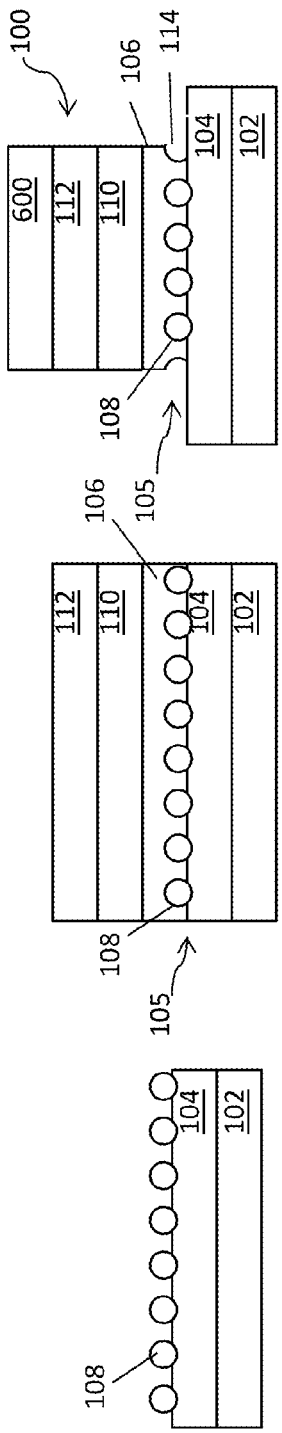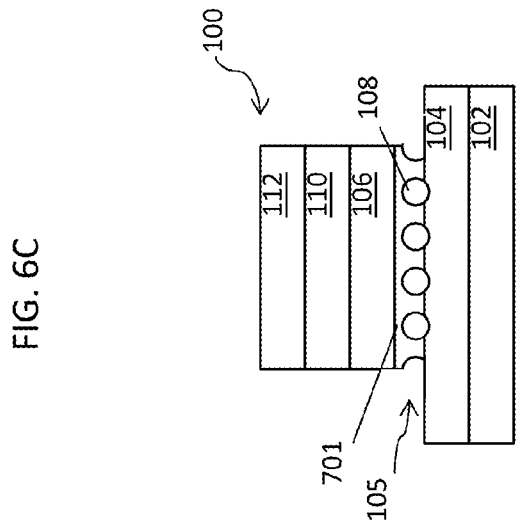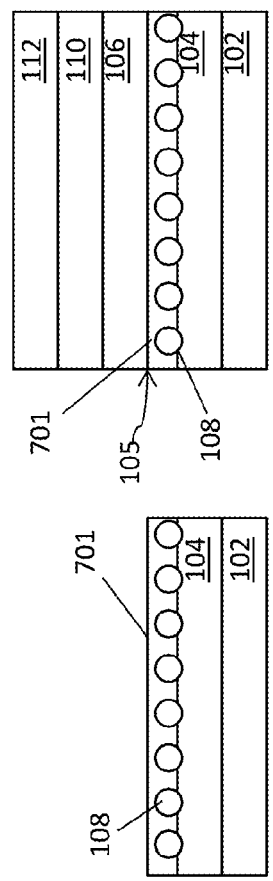

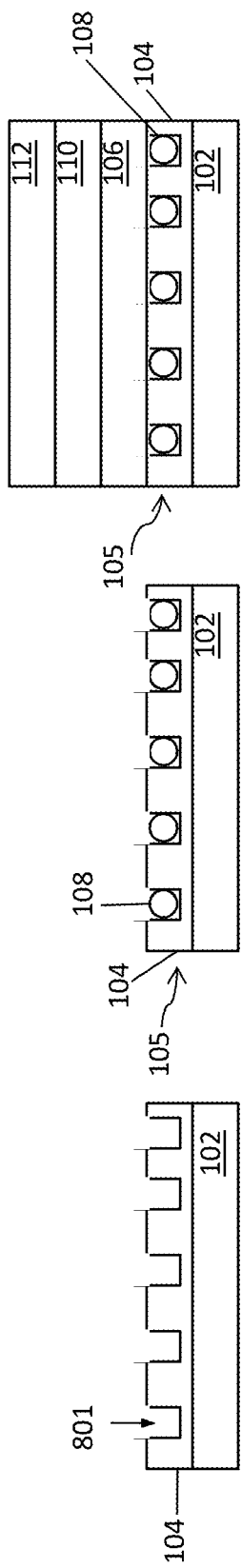

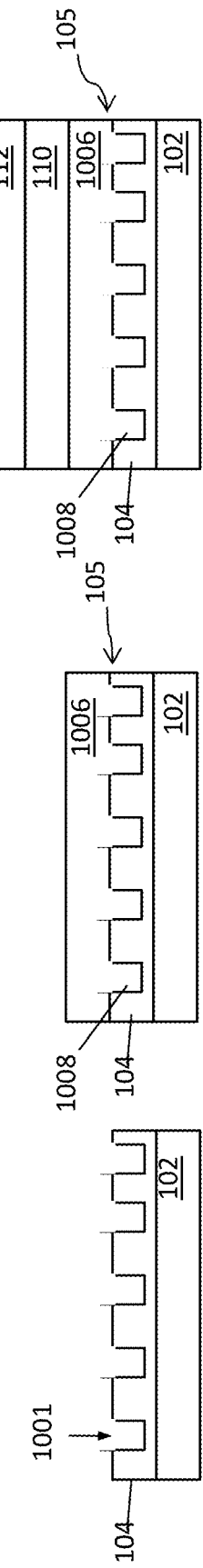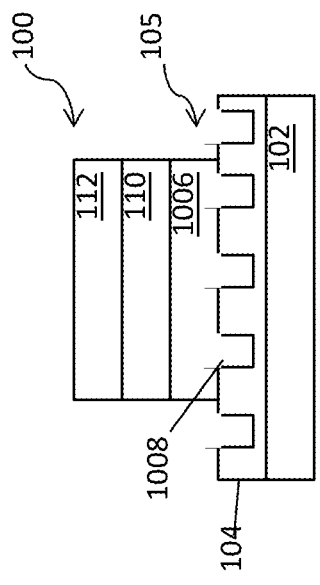
FIG.10A
FIG.10B
FIG.10C
FIG.10D

NANODOT ENHANCED HYBRID FLOATING GATE FOR NON-VOLATILE MEMORY DEVICES

FIELD OF THE INVENTION

The present invention relates to memory having a hybrid floating gate comprising a continuous layer of an electrically conductive material and at least one protrusion of an electrically conductive material facing a tunnel dielectric layer and electrically shorted to the continuous layer.

BACKGROUND

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage $V_{PGM}$ applied to the control gate during a program operation is applied as a series of pulses that increase in magnitude over time. In one possible approach, the magnitude of the pulses is increased with each successive pulse by a predetermined step size, e.g., 0.2-0.4 V. $V_{PGM}$ can be applied to the control gates of flash memory elements. In the periods between the program pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically $V_{PGM}$ is applied to the control gate and the bit line is grounded, causing electrons from the channel of a cell or memory element, e.g., storage element, to be injected into the floating gate. When electrons accumulate in the floating gate, the floating gate becomes negatively charged and the threshold voltage of the memory element is raised so that the memory element is considered to be in a programmed state. More information about such programming can be found in U.S. Pat. No. 6,859,397, titled "Source Side Self Boosting Technique For Non-Volatile Memory," and in U.S. Pat. No. 6,917,542, titled "Detecting Over Programmed Memory," issued Jul. 12, 2005; both of which are incorporated herein by reference in their entirety.

Recent fabrication techniques allow the floating gate of a non-volatile memory to be formed from nanodots, e.g., small charge-storing particles. Such techniques have gained interest as memory device dimensions continue to scale down.

SUMMARY

Embodiments include a memory device that includes a semiconductor channel, a tunnel dielectric layer located over the semiconductor channel, a floating gate located over the tunnel dielectric layer, the floating gate comprising a continuous layer of an electrically conductive material and at least one protrusion of an electrically conductive material facing the tunnel dielectric layer and electrically shorted to the continuous layer, a blocking dielectric region located over the floating gate, and a control gate located over the blocking dielectric layer.

Further embodiments include a method of fabricating a memory device that includes forming a tunnel dielectric layer over a semiconductor channel, forming a floating gate over the tunnel dielectric layer, the floating gate comprising a continuous layer of an electrically conductive material and at least one protrusion of an electrically conductive material facing the tunnel dielectric layer and electrically shorted to the continuous layer, forming a blocking dielectric region over the floating gate, and forming a control gate over the blocking dielectric layer.

BRIEF DESCRIPTION OF THE DRAWINGS

The accompanying drawings, which are incorporated herein and constitute part of this specification, illustrate exemplary embodiments of the invention, and together with the general description given above and the detailed description given below, serve to explain the features of the invention.

FIGS. 4A-B schematically illustrate the electric field concentrations of an embodiment memory device having a hybrid floating gate (FIG. 4A), and a prior art device having a continuous layer floating gate (FIG. 4B).

FIG. 5A schematically illustrates a side cross sectional view of an embodiment memory device with an enlarged view of a corner region of a hybrid floating gate.

FIG. 5B schematically illustrates a side cross sectional view of a prior art memory device with an enlarged view of a corner region of a continuous layer floating gate.

FIGS. 6A-C schematically illustrate a method of fabricating a memory device having a hybrid floating gate including a continuous layer and a plurality of nanodot protrusions according to one embodiment.

FIGS. 7A-C schematically illustrate a method of fabricating a memory device having a hybrid floating gate including a continuous layer and a plurality of nanodot protrusions according to another embodiment.

FIGS. 8A-D schematically illustrate a method of fabricating a memory device having a hybrid floating gate including a continuous layer and a plurality of nanodot protrusions according to yet another embodiment.

FIGS. 10A-D schematically illustrate a method of fabricating a memory device having a hybrid floating gate including a continuous layer a plurality of protrusions formed as a unitary structure.

DETAILED DESCRIPTION

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims.

Figure 1:
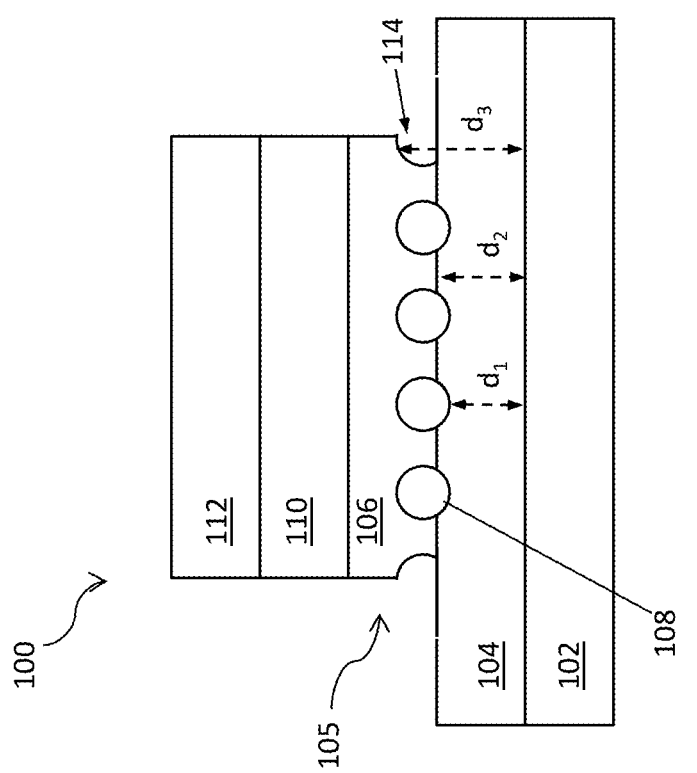
FIG. 1 illustrates a side cross sectional view of one embodiment of a memory device having a hybrid floating gate comprising a continuous layer of an electrically conductive material and a plurality of an electrically conductive nanodots electrically facing a tunnel dielectric layer and electrically shorted to the continuous layer.

An exemplary embodiment of a memory device 100 is illustrated in the schematic cross-section of FIG. 1. The memory device 100 includes a substrate 102, which may be a silicon substrate or wafer or any other semiconductor or semiconductor on insulator (SOI) substrate. The substrate 102 includes a doped semiconductor channel region (not shown) that may be formed by implantation and annealing processes. For example, one or more wells (e.g., a triple well of p-type and/or n-type ion implanted regions) may be formed in the substrate 102 prior to forming a layer stack over the substrate surface. The term substrate may include reference to these semiconductor channel regions.

A tunnel dielectric layer 104, such as an oxide (e.g., $SiO_2$) layer, is located over the substrate 102. The tunnel dielectric layer 104 can be formed in one embodiment by growing a layer of $SiO_2$ by dry or wet oxidation of the silicon substrate 102. A $SiO_2$ CVD or ALD deposition process could alternately be used.

A memory element, comprising a floating gate layer 105, a blocking dielectric layer 110 over the floating gate layer 105, and a control gate layer 112 over the blocking dielectric layer, is located over the tunnel dielectric layer 104. A memory device may typically include a plurality of memory elements forming an array of memory elements located over the semiconductor channel region(s) of the substrate 102. An array may include one or more strings of memory elements (e.g., a NAND string) located between source-side and drain-side select gate transistors. Each memory element may include a charge storage element, in the form of floating gate layer 105 and a blocking dielectric layer 110 over the floating gate layer 105. The control gate layer 112 may be formed of a conductive material and may be capacitively coupled to the floating gate layer 105 through the intermediate blocking dielectric layer 110. The control gate layer 112 may extend in a direction perpendicular to the direction of the string(s) of memory elements in the array to define a word line extending over multiple strings of memory elements.

The floating gate 105 may be a hybrid floating gate that includes a continuous layer 106 of an electrically conductive material and at least one protrusion 108 of an electrically conductive material facing the tunnel dielectric layer 104 and electrically shorted to the continuous layer 106. As used herein, the term electrically shorted includes direct physical and electrical contact between the protrusion 108 and the layer 106, an electrical contact and an indirect physical contact between the protrusion 108 and the layer 106, and the protrusion 108 and layer 106 being parts of the same monolithic body or layer. The continuous layer 106 may comprise one or more metal materials and/or a doped semiconductor material, such as doped polysilicon having a doping concentration of greater than $1 \times 10^{17}$ cm$^{-3}$. The at least one protrusion 108 may be formed of the same or a different material than the continuous layer 106. The at least one protrusion 108 may physically contact the continuous layer 106, and may be integrally formed with the continuous layer 106. In other embodiments, the at least one protrusion 108 may be physically separated from the continuous layer 106 by a thin dielectric material allowing direct electronic tunneling between the at least one protrusion 108 and the continuous layer 106 (i.e., so that the at least one protrusion is electrically shorted to the continuous layer 106). For example, the at least one protrusion 108 may be separated from the continuous layer 106 by a <2 nm layer of $SiO_2$, which is less than the direct tunneling limit for $SiO_2$.

The at least one protrusion 108 may extend at least partially from a surface of the continuous layer 106 facing the tunnel dielectric layer 104. As shown in FIG. 1, the thickness of the tunnel dielectric layer 104, corresponding to the distance, $d_1$, between the surface of the substrate 102 and the at least one protrusion 108, may be less than the thickness of the tunnel dielectric 104, corresponding to the distance, $d_2$, between the surface of the substrate 102 and the continuous layer 106.

The at least one protrusion 108 may be formed of one or more materials including titanium nitride (TiN), silicon (Si), cobalt (Co), gold (Au), iridium (Ir), iron platinum alloys (FePt), nickel (Ni), palladium (Pd), platinum (Pt), ruthenium (Ru), tantalum (Ta), tantalum nitride (TaN), tellurium (Te), tungsten (W), and the like. In embodiments, the at least one protrusion 108 may be formed of one ore more materials with high work functions (e.g., 4 eV or higher, such as 4.5-6 eV), such as Ru, Ta or TaN. The floating gate layer 105 may include a plurality of protrusions 108 electrically shorted to the continuous layer 106 and facing the tunnel dielectric layer 104. In various embodiments, such as illustrated in FIG. 1, the protrusions 108 may include a plurality of nanodots between the continuous layer 106 and the tunnel dielectric layer 104, as described below.

A blocking dielectric layer 110 is located over the floating gate layer 105. The blocking dielectric 110 (i.e., inter-gate dielectric) layer may comprise a plurality of layers, including oxide-nitride-oxide (ONO) layers, an aluminum oxide ($Al_2O_3$) layer, and a hafnium oxide ($HfO_2$) layer. In some embodiments, the blocking dielectric may include all high-k dielectric materials, such as $Al_2O_3/HfO_2$ or an $ONO/Al_2O_3/HfO_2$ stack.

The control gate layer 112 is formed over the blocking dielectric layer 110. The control gate layer 112 may be formed of a conductive material, such as a metal (e.g., tungsten), or another conductive material such as tungsten nitride (WN) or a heavily-doped semiconductor material (e.g., polysilicon). A barrier metal layer (not shown) may be formed between the blocking dielectric layer 110 and the control gate layer 112. The barrier metal layer may be, for example, TiSiN or TaN, which may be formed by ALD over the blocking dielectric layer 110, and the control gate layer 112 may be formed over the barrier metal layer.

In various embodiments of a memory device 100, the at least one protrusion 108 of the hybrid floating gate layer 105 is a nanostructure protrusion, meaning that at least one characteristic dimension of the protrusion 108 is less than about 500 nm along the smallest axis of the protrusion 108. Nanostructures may have one or more, such as two or three characteristic dimensions that are less than 500 nm, for example, 2-100 nm, such as less than 10 nm (e.g., 2-9 nm), or even less than 1 nm. In some nanostructures, each of its dimensions may be less than 10 nm, or even less than 1 nm. By way of non-limiting example, nanostructures include nanowires, nanorods, nanotubes, bridge nanostructures, nanotetrapods, tripods, bipods, and roughly or exactly spherical nanostructures which are referred to as nanodots, but may also be referred to as nanoparticles, quantum dots (nanostructure with quantum confinement) or nanocrystals (having a crystalline structure). Nano structures can be, for example, substantially crystalline, substantially mono-crystalline, polycrystalline, amorphous or a combination thereof.

As shown in FIG. 1, a nanostructure protrusion 108 may be comprised of substantially spherical nanostructures or nanodots. Nanostructures can include essentially any material. Charge storing nanostructures may include conductors and heavily doped semiconductors. An array of nanostructures may be pre-formed or synthesized prior to incorporation into the memory structure. For example, the nanostructures may include a coating having a ligand associated with a surface of the nanostructure, for example, a silsesquioxane ligand. Nanostructures may also be coated with insulating shells such as oxides or nitrides. In one example, the nanostructures are metal particles which are generally spherical (i.e., nanodots) and have a diameter of about 1 to 30 nm, such as 1-5 nm, for example 1-3 nm. Although, other sizes and shapes can be used as well (e.g., polygonal).

Nanostructure coatings may include one or more nanostructure layers. In one embodiment, the nanostructures are free of solvent in their formation, while in others the nanostructures are dispersed in one or more solvents. The nanostructures may form a disordered or ordered array such as an ordered monolayer or multilayer. A solution of nanostructures can be formed by deposition processes, including spin coating, dip coating, spraying, soaking and other techniques. More information regarding nanostructures and their solutions can be found in U.S. Pat. No. 7,723,186 to Purayath, et al., and U.S. Pat. No. 8,193,055 to Purayath et al., which are both incorporated by reference herein in their entirety.

In one example, polymer micelle technology may be employed to form nanostructures with a high degree of uniformity. Such technology can be used to fabricate self-aligned nanostructures with sizes, e.g., from a few nm to 30 nm (or more). A copolymer solution may be formed, followed by adding salt to provide metal salt ions in a core or micelle, e.g., cavity, of the copolymer, and performing a metal salt reduction to form a metal nanostructure in the core. The polymers may in powdered form, for example, and dissolved in an organic solvent. In other examples, the nanostructures are not dispersed in a solvent.

The copolymer solution with the nanostructures can be deposited onto a surface, such as the surface of the tunnel dielectric layer 104. The size and spacing of the nanostructures can be tailored based on the molecular weight of the block copolymer and the amount of the metal salt used. The amount of charge that may be stored by a nanostructure depends on its size, which is a function of the copolymer ratio that has been used to form the micelle. After being deposited, the solution may be partially or entirely removed from the nanostructures, such as by evaporation.

In one embodiment, a coupling or association agent is used to form the nanostructure coating. A coupling layer may be disposed over a dielectric (e.g., oxide) layer. The coupling layer can include a chemical group that interacts with a nanostructure and/or ligand coating of a nanostructure. The coupling layer may be an amino functional silane group. By way of example, coupling layers include thiol, amine, alcohol, phosphonyl, carboxyl, boronyl, fluorine, phosphinyl, alkyl, aryl, etc.

A nanostructure coating may then be applied over the substrate. The nanostructures may be coated with a ligand to interact with the coupling layer. The nanostructures and/or ligands interact with the coupling layer, forming one or more nanostructure layers over the dielectric (e.g., oxide) layer at the active areas of the substrate. The substrate with the nanostructures can be dried, such as by dry nitrogen blowing with no heat. The coupling layer may be removed after forming the nanostructure coating.

The nanostructure coating may be subjected to ultraviolet (UV) curing over all or a portion of the nanostructure coating. Photoresist or another suitable masking material can be applied over select regions of the coating before applying UV light to the substrate surface. After selectively curing the nanostructure layer, a rinse or wash can be applied to the substrate which will remove the nanostructure layer at locations where it has not been cured. Other techniques can be used to remove the nanostructure layer from select region(s).

Photoactivatable compounds may be incorporated into a nanostructure solution. Where a coupling layer is used, the coupling layer material composition may be photoactivatable, such that the bond between the coupling layer and ligand or nanostructure is formed only upon exposure to light. Numerous photoactivatable compounds as known in the art may be used. By way of example, such compounds may include a phenyl azide group, which when photoactivated can from a covalent bond with, e.g., a silsesquioxane ligand comprising a coating associated with a surface of the nanostructures. Other photoactivatable compounds include an aryl azide group (e.g., a phenyl azide, hydroxphenyl azide, or nitrophenyl group), a psoralen, or a diene.

Figures 2A, 2B:
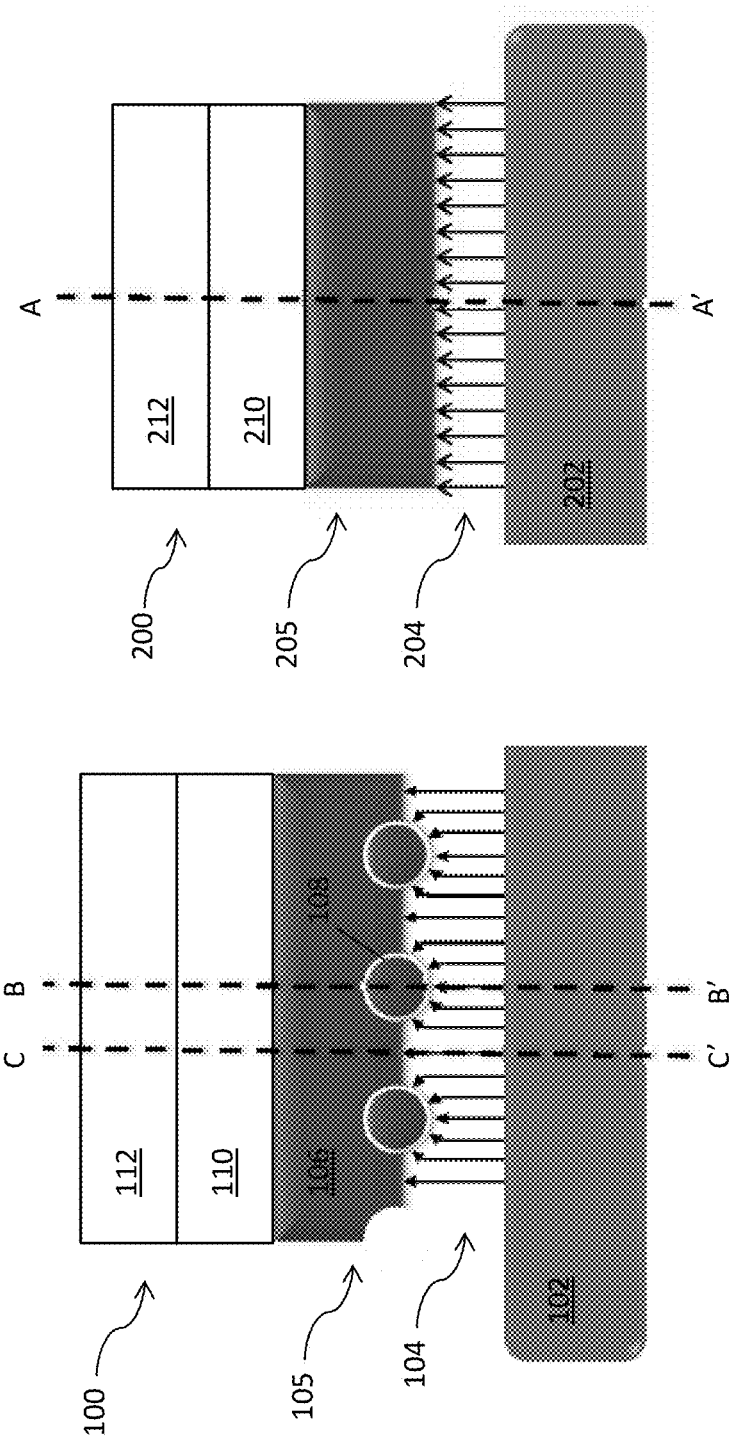
FIGS. 2A-B illustrate side cross sectional views of an embodiment memory device having a hybrid floating gate and a memory device of the prior art with a floating gate of a continuous layer of electrically conductive material.

FIG. 2A illustrates an embodiment memory device 100 having a hybrid floating gate 105 and FIG. 2B illustrates a memory device 200 of the prior art having a floating gate 205 of a continuous layer of electrically conductive material. The hybrid floating gate 105 in FIG. 2A includes a continous layer 106 of doped polysilicon, and a plurality of nanodot protrusions 108 of a high work function metal, such as ruthenium. In the prior art device 200 of FIG. 2B, the floating gate 205 is a continuous layer of doped polysilicon. Both devices 100, 200 also include a semiconductor substrate 102, 202, a tunnel dielectric layer 104, 204, a blocking dielectric layer 110, 210 and a control gate layer 112, 212.

Figure 3A:
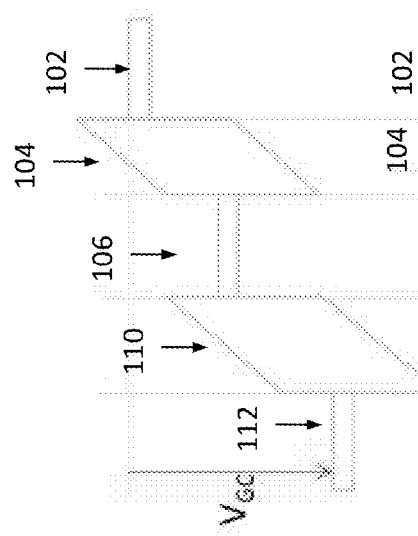
FIGS. 3A-C are schematic energy band diagrams for the memory devices of FIGS. 2A and 2B taken along lines C-C', B-B' and A-A', respectively.
Figure 3B:
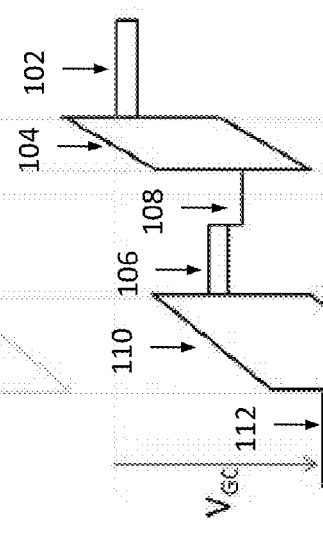
Figure 3C:
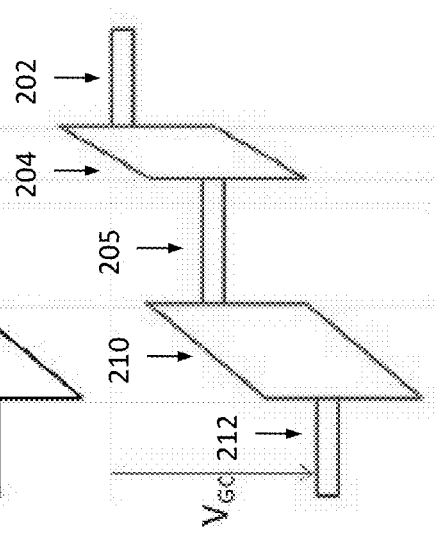

The embodiment memory device 100 of FIG. 2A has a higher electron energy barrier for "gate-to-substrate" leakage than the prior art device 200 of FIG. 2B. This may be due in part to the metallic nanodot protrusions 108 having a higher work function than the polysilicon continuous layer(s) 106, 206. During programming (PGM) or erasing (ERA) of the memory device 100, most current flow is channeled through the nanodot protrusions 108 (as illustrated by arrows in FIG. 2A) due to the electric field enhancement resulting from the shape and proximity of the nanodot protrusions 108 to the semiconductor channel 102. This means that the regions which channel current are also protected by an energy barrier. The regions of the floating gate 105 without nanodot protrusions 108 (i.e., the continuous layer 106) are spaced further from the substrate 102 than in the continuous layer floating gate 205 of the prior art device 200, so the electric field is lower and the barrier width is higher. This comparatively higher barrier for gate to substrate leakage is schematic illustrated by energy band diagrams shown in FIGS. 3A-3C. FIG. 3A shows the conduction and valence bands of the embodiment device 100 taken along C-C' (i.e., through the continuous layer 106 but not the protrusions 108 of the hybrid floating gate 105). FIG. 3B illustrates the conduction and valence bands of the embodiment device 100 taken along line B-B' of FIG. 2A (i.e., through the control gate 112, blocking dielectric 110, polysilicon continuous layer 106, nanodot protrusion 108, tunnel dielectric 104 and substrate 102). FIG. 3C illustrates the conduction and valence bands of the prior art device 200 taken along line A-A' of FIG. 2B (i.e., through the control gate 212, blocking dielectric 210, continuous polysilicon floating gate 205, tunnel dielectric 204 and substrate 202). The tunnel dielectric 104 between the continuous layer 106 of the embodiment device 100 and the substrate 102 is thicker the tunneling dielectric 204 than between the floating gate 205 and the substrate 202 in the prior art device 200.

An embodiment memory device 100 having a hybrid floating gate may also provide a reduced tunneling area as compared to prior art device having a conventional, continuous layer floating gate. This is schematically illustrated in FIGS. 4A and 4B, which show, respectively, the hybrid floating gate 105, tunnel oxide layer 104 and substrate 102 of an embodiment device (FIG. 4A), and the floating gate 205, tunnel oxide layer 204 and substrate 202 of a prior art device (FIG. 4B). The tunneling area beneath the hybrid floating gate 105 is decreased because of the electric field enhancement 401 beneath the nanodot protrusions, as shown in FIG. 4A. Other regions beneath the hybrid floating gate 105 are characterized by a lessened electric field, as compared to the electric field 403 beneath the floating gate 205 of the prior art device (see FIG. 4B), because the insulator 104 between the continuous layer 106 of the embodiment device and the substrate 102 is thicker than in the prior art device. This decreases the memory cell's susceptibility to defects which may exist in the tunnel oxide layer 104.

As shown in FIG. 5A, a memory device 100 having a hybrid floating gate 105 may include a central region 501 and at least one corner region 503, and the at least one protrusion 108 (e.g., the plurality of nanodots) may be located in the central region 501 and not in the at least one corner region 503. The corner region 503 may be formed by etching or otherwise removing portions of the continuous layer 106 and/or the nanodot protrusions 108 to form discrete memory elements having one or more sidewalls (e.g., 2-4 sidewalls), and the corner region 503 may correspond to a sidewall of the device 100. During the etching process, which may use an oxygen plasma and/or a chlorine and $CH_4$ gas etchant, the nanodot protrusions 108 not completely protected by the continuous layer 106 may be removed during the etch. Alternatively, a separate etching step may be used to remove any exposed protrusions 108 in the corner region(s) 503 from beneath the continuous layer 106. This has the effect of raising the corners 114 of the continuous layer 106 portions of the hybrid floating gate 105. As shown in FIG. 1, for example, the distance, $d_3$, between the surface of the substrate 102 and the continuous layer 106 at the corner 114 of the continuous layer 106 may be greater than the distance, $d_2$, between the continuous layer 106 and the substrate 102 in the rest of the device 100.

FIG. 5A shows an embodiment memory device 100 with an enlarged view of a corner region 503. The nanodot protrusion(s) 108 are removed from the corner region 503, providing a continuous layer 106 with a raised corner 114. FIG. 5B shows a memory device 200 of the prior art having a continuous layer floating gate 205 with a conventionally-shaped corner 214, as illustrated in the enlarged view of the corner region 503. Such conventionally-shaped corners 214 tend to trap charge in the corners of the floating gate 205 and can result in high-stress induced leakage current through the tunnel dielectric layer 204. In contrast, by locating the protrusions 108 over the middle portion 501 but not in the corner regions 503, as shown in FIG. 5A, the electric field and charge trapping is more uniform over the device 100. In addition, the raised corner 114 may decrease the unintentional Program/Erase of dielectric regions between cells caused by high field at conventional floating gate corners, such as corner 214 shown in FIG. 5B. Simulations show that the erase field on conventional floating gate cells is concentrated at the sharp corners of the floating gate, leading to tunnel oxide degradation. A hybrid floating gate 105 as shown in FIG. 5A may eliminate this problem due to corner effect mitigation and by concentrating the electric field beneath the nanodot protrusions 108.

In certain embodiments, such as where the protrusions are 108 are metal and the continuous layer 106 is a semiconductor (e.g., polysilicon) material, the ballistic electron travel into the floating gate 105 may be decreased, as the mean free path of electrons in a metal is approximately 2 nm, whereas the mean free path of electrons in a semiconductor material such as polysilicon is around 50 nm. This reduction in ballistic electron travel may be particularly advantageous in a "flat cell" memory element. In a "flat cell" design, discrete memory elements (i.e., cells) are formed as a stack, including a nanostructure-containing charge storage layer or region (e.g., the floating gate) and a blocking dielectric layer aligned over the charge storage layer or region, where the blocking dielectric does not "wrap-around" the sides of the charge storage layer or region (e.g., the floating gate). A control gate is formed over the blocking dielectric and charge storage layers. Exemplary embodiments of nanostructure-containing memory devices having a "flat cell" design and methods of fabricating such devices are disclosed in U.S. Patent Application Publication No. 2011/0020992, published on Jan. 27, 2011, the entire contents of which are incorporated herein by reference.

In general, the programming of a memory element having a hybrid floating gate 105 (such as shown in FIGS. 1, 2A, 4A and 5A) may by performed at the same or similar voltage as a conventional memory element with a continuous layer floating gate 205 (such as shown in FIGS. 2B, 4B and 5B). The erase voltage in the hybrid floating gate device may be lower than that of a continuous metallic-sheet floating gate or a conventional semiconductor (e.g., polysilicon) floating gate device due to electric field concentration. The erase voltage can be higher if electric field concentration does not negate the effect of the higher electron energy barrier presented by the higher work function protrusion(s) (e.g., metallic nanodots).

A memory element having a hybrid floating gate 105 (such as shown in FIGS. 1, 2A, 4A and 5A) may improve the endurance and data retention performance relative to a conventional memory element with a continuous layer floating gate 205 (such as shown in FIGS. 2B, 4B and 5B).

FIGS. 6A-6C illustrate a method of fabricating a memory device 100 having a hybrid floating gate 105 including a continuous layer 106 and a plurality of nanodot protrusions 108, according to one embodiment. A plurality of nanodots 108 may be formed over the tunnel oxide layer 104 and substrate 102, as shown in FIG. 6A. An optional coupling agent, such as any suitable organic material which makes the oxide surface hydrophobic (e.g., hexamethyldisilazane (HDMS), etc.) may be provided over the tunnel oxide layer 104. The oxide surface layer may then be coated with nanodots 108, for example, by spin coating the nanodots 108, which may be coated with ligand(s) and be in a solution, such as a polymer solution, onto the tunnel oxide layer 104. The nanodots 108 may be UV cured to adhere the nanodots 108 to the surface of the tunnel oxide layer 104. Optionally, the nanodots 108 may be surface nitrided (such as via plasma nitridation and/or deposition of a SiN barrier layer), as is described U.S. application Ser. No. 13/708,587, entitled "NAND Memory Device Containing Nanodots and Method of Making Thereof," filed on Dec. 7, 2012, the entire contents of which are incorporated herein by reference.

One or more additional coatings of nanodots and ligands may be coated on the oxide surface layer to increase the density of nanodots in the nanodot layer, filling in gaps left from the first coating, as described in U.S. application Ser. No. 13/708,587, which has been incorporated by reference. Any additional coatings may also be applied via spin coating and UV cured to adhere the additional nanodots to the oxide surface layer.

Following nanodot 108 deposition, a cure and/or rapid thermal processing step(s) may be performed to volatize hydrocarbons and provide densification of the nanodot layer.

A continuous layer 106 of a conductive material, such as a highly-doped semiconductor (e.g., polysilicon) or metal, may be formed over the nanodot 108 layer and the tunnel dielectric layer 104 to form a hybrid floating gate 105, as shown in FIG. 6B. The continuous layer 106 may be formed by chemical vapor deposition (CVD), for example. The continuous layer 106 may be formed in direct contact with the nanodot protrusions 108, as shown in FIG. 6B. Alternatively, the continuous layer 106 may be physically separated from the nanodot protrusions 108 by a thin layer of dielectric material, such as a nitride and/or oxide barrier shell around a conductive core of the nanodots 108, allowing direct electronic tunneling between the nanodots 108 and the continuous layer 106 (i.e., so that the nanodot protrusions 108 are electrically shorted to the continuous layer 106). For example, the nanodot protrusions 108 may be separated from the continuous layer 106 by a <2 nm layer of $SiO_2$, which is less than the direct tunneling limit for $SiO_2$.

A blocking dielectric layer 110 may then be formed over the continuous layer 106 of the hybrid floating gate 105. The blocking dielectric (i.e., inter-gate dielectric) layer 110 may comprise a plurality of layers, including oxide-nitride-oxide (ONO) layers, an aluminum oxide ($Al_2O_3$) layer, and/or a hafnium oxide ($HfO_2$) layer. In some embodiments, the blocking dielectric layer 110 may include all high-k dielectric materials, such as $Al_2O_3/HfO_2$ or an $ONO/Al_2O_3/HfO_2$ stack.

A control gate layer 112 of a conductive material, which may be a metal, such as tungsten, or another conductive material such as tungsten nitride (WN) or a heavily-doped semiconductor material (e.g., polysilicon), may be formed over the blocking dielectric layer 110. A barrier metal layer (not shown) may optionally be formed between the blocking dielectric layer 110 and the control gate layer 112. The barrier metal layer may be, for example, TiSiN or TaN, which may be formed by ALD over the blocking dielectric layer 110, the control gate layer 112 may be formed over the barrier metal layer.

Portions of the control gate layer 112, the blocking dielectric layer 110, the continuous layer 106 and the nanodot protrusions 108 may be removed, such as by etching, to provide individual memory elements 100 having a hybrid floating gate 105, as shown in FIG. 6C. A patterned mask 600, such as a hard mask and/or photoresist, may be formed over the control gate layer 112, and the device may be etched using the mask through the control gate layer 112, the blocking dielectric layer 110, the continuous layer 106 and nanodot protrusions 108, stopping at the tunnel dielectric layer 104. The etching may remove nanodot protrusions 108 proximate the corner regions of the continuous layer 106, producing a continuous layer 106 having raised corner(s) 114, as shown in FIG. 6C.

FIGS. 7A-7C illustrate a method of fabricating a memory device 100 having a hybrid floating gate 105 according an additional embodiment. As shown in FIG. 7A, a plurality of nanodots 108 may be formed over the tunnel oxide layer 104 and substrate 102, as described above in connection with FIG. 6A. A dielectric material layer 701 may then be formed over the nanodots 108 and the tunnel oxide layer 104 such that the nanodots 108 are at least partially embedded within dielectric material layer 701. The dielectric material 701 may include $SiO_2$ or other oxide material, a high dielectric constant (high-k) material such as aluminum oxide ($Al_2O_3$), hafnium oxide ($HfO_2$), silicon nitride, zirconium oxide ($ZrO_2$) or combinations of these materials. The dielectric material layer 701 may be deposited or grown over the nanodots 108 and tunnel oxide layer 104 and planarized, such as by etching or chemical mechanical polishing (CMP) to provide a thin region of dielectric material over the surface of the nanodots (i.e, with a thickness less than the direct tunnel limit of the dielectric material). Optionally, the nanodots 108 may be partially exposed through the surface of dielectric material layer 701.

A continuous layer 106 of a conductive material, such as a highly-doped semiconductor (e.g., polysilicon) or metal, may be formed over the dielectric material layer 701 and nanodots 108, to form a hybrid floating gate 105, as shown in FIG. 7B. Where the nanodots 108 are partially exposed through the dielectric material layer 701, the continuous layer 106 may be formed in direct contact with the nanodots 108. Alternatively, the continuous layer 106 may be physically separated from the nanodot protrusions 108 by a thin region of the dielectric material layer 701, as shown in FIG. 7B, allowing direct electronic tunneling between the nanodots 108 and the continuous layer 106 (i.e., so that the nanodot protrusions 108 are electrically shorted to the continuous layer 106). For example, the nanodot protrusions 108 may be separated from the continuous layer 106 by a <2 nm layer of $SiO_2$, which is less than the direct tunneling limit for $SiO_2$.

A blocking dielectric layer 110 may be formed over the continuous layer 106, and a control gate layer 112 may be formed over the blocking dielectric layer 110, as described above. Portions of the control gate layer 112, the blocking dielectric layer 110, the continuous layer 106, the dielectric material layer 701, and the nanodot protrusions 108 may be removed, such as by etching, to provide individual memory elements 100 having a hybrid floating gate 105, as shown in FIG. 7C.

FIGS. 8A-8D illustrate a method of fabricating a memory device 100 having a hybrid floating gate 105 according to yet another embodiment. A tunnel dielectric layer 104 may be formed over a substrate 102. Void areas 801, such as grooves, may be formed in the surface of the tunnel dielectric layer 104 such as by etching of the dielectric layer 104 exposed in a resist or other mask opening. A plurality of nanodot protrusions 108 may be formed over the tunnel dielectric layer 104 such that the nanodots 108 are located within the void areas 801, as shown in FIG. 8A. Although FIG. 8A illustrates a single nanodot 108 within each void area 801, it will be understood that each void area 801 may contain a plurality of nanodots. The nanodots 108 may also extend at least partially above the surface of the tunnel dielectric layer 104. A continuous layer 106 of a conductive material, such as a highly-doped semiconductor (e.g., polysilicon) or metal, may be formed over the tunnel dielectric layer 104 and nanodots 108 to form a hybrid floating gate 105, as shown in FIG. 8B. The continuous layer 106 may be formed so that the nanodot protrusions 108 are electrically shorted to the continuous layer (i.e., such that the nanodots 108 are physically touching the continuous layer 106 or are separated from the continuous layer 106 by a thin dielectric layer that allows direct electronic tunneling between the nanodots 108 and the continuous layer 106). As shown in FIG. 8C, a blocking dielectric layer 110 may be formed over the continuous layer 106, and a control gate layer 112 may be formed over the blocking dielectric layer 110, as described above. Portions of the control gate layer 112, the blocking dielectric layer 110, and the continuous layer 106 may be removed, such as by etching, to provide individual memory elements 100 having a hybrid floating gate 105, as shown in FIG. 8D. The nanodots 108 not covered by a memory element 100 may also be removed during the etching step or during a separate removal process.

Figure 9A:
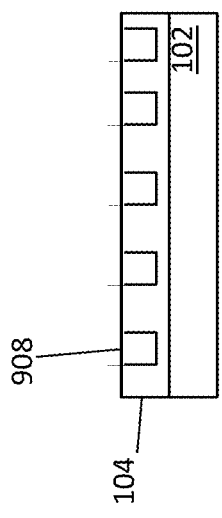
FIGS. 9A-E schematically illustrate a method of fabricating a memory device having a hybrid floating gate including a continuous layer and a plurality of protrusion regions according to one embodiment.
Figure 9B:
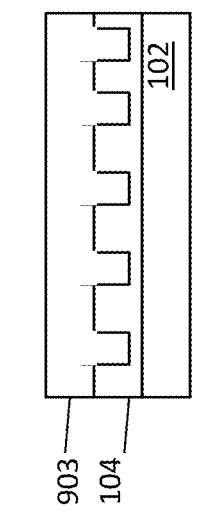
Figure 9C:
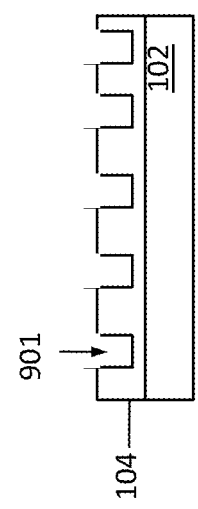
Figure 9D:
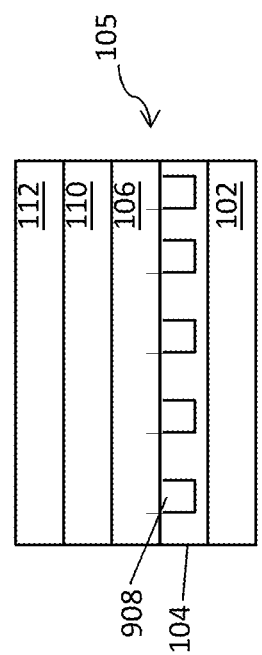
Figure 9E:
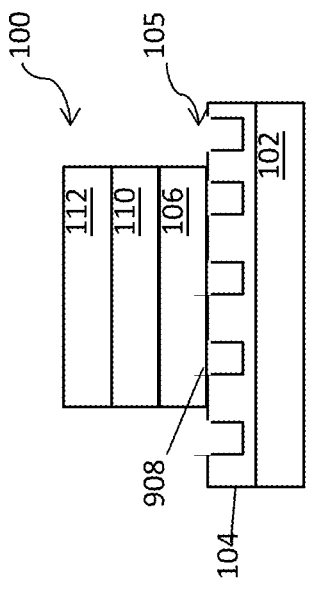

FIGS. 9A-9E illustrate a method of fabricating a memory device 100 having a hybrid floating gate 105 according yet another embodiment. A tunnel dielectric layer 104 may be formed over a substrate 102. Void areas 901, such as grooves, may be formed in the surface of the tunnel dielectric layer 104 such as by etching of the dielectric layer 104 exposed in a resist or other mask opening, as shown in FIG. 9A. A first conductive material layer 903, which may be formed of a metal or a highly-doped semiconductor (e.g., polysilicon) material, may be formed over the tunnel dielectric layer 104 and within the void areas 901, as shown in FIG. 9B. The first conductive material layer 903 may be planarized, such as by etching or chemical mechanical processing (CMP), to expose the surface of the tunnel dielectric layer 104 and form discrete protrusion regions 908 of the first conductive material within the void areas 901, as shown in FIG. 9C. A continuous layer 106 of a conductive material, such as a highly-doped semiconductor (e.g., polysilicon) or metal, may be formed over the tunnel dielectric layer 104 and protrusion regions 908 to form a hybrid floating gate 105 having a continuous layer 106 and a plurality of protrusions 908 electrically shorted to the continuous layer 106, as shown in FIG. 9D. The protrusions 908 and the continuous layer 106 may be formed of the same or different materials. In one embodiment, the protrusions 908 are formed of a high-work function material, such as ruthenium, tantalum or tantalum nitride, and the continuous layer 106 may be a highly-doped semiconductor material (e.g., polysilicon). As shown in FIG. 9E, a blocking dielectric layer 110 may be formed over the continuous layer 106, and a control gate layer 112 may be formed over the blocking dielectric layer 110, as described above. Portions of the control gate layer 112, the blocking dielectric layer 110, and the continuous layer 106, may be removed, such as by etching, to provide individual memory elements 100 having a hybrid floating gate 105, as shown in FIG. 9C. The protrusions 908 not covered by a memory element 100 may also be removed during the etching step or during a separate removal process.

FIGS. 10A-10D illustrate a method of fabricating a memory device 100 having a hybrid floating gate 105 according yet another embodiment. A tunnel dielectric layer 104 may be formed over a substrate 102. Void areas 1001, such as grooves, may be formed in the surface of the tunnel dielectric layer 104 such as by etching of the dielectric layer 104 exposed in a resist or other mask opening, as shown in FIG. 10A. A conductive material layer 1006, which may be formed of a metal or a highly-doped semiconductor (e.g., polysilicon) material, may be formed over the tunnel dielectric layer 104 and within the void areas 1001, as shown in FIG. 10B. The conductive material layer 1006 may form a unitary hybrid floating gate 105 having a continuous layer 1006 and a plurality of protrusion regions 1008 extending into the void areas 1001 of the tunnel dielectric layer 104. A blocking dielectric layer 110 may be formed over the continuous layer 1006, and a control gate layer 112 may be formed over the blocking dielectric layer 110, as shown in FIG. 10C and as described above. Portions of the control gate layer 112, the blocking dielectric layer 110, and the continuous layer 1006, may be removed, such as by etching, to provide individual memory elements 100 having a hybrid floating gate 105, as shown in FIG. 10D.

It should be noted that the above described hybrid floating gate according to the various embodiment may be formed in any suitable nonvolatile memory device, such as an EEPROM charge storage transistor having one control gate/one floating gate per channel, or NAND device having plural control gates/plural floating gates per channel between the source and drain regions. For example, the hybrid floating gate may be located in any of the devices described in U.S. published application 2011/0020992 A1, published on Jan. 27, 2011 naming Vinod R. Purayath et al. as inventors, the entire contents of which are incorporated herein by reference. Specifically, the hybrid floating gate described in one or more of the above-described embodiments may be substituted for the nanostructure coating 328, 426 or 532 of the 2011/0020992 application. The hybrid floating gate may also be located in any of the devices described in U.S. patent application Ser. No. 13/690,054, filed Nov. 30, 2012 to Purayath et al., and entitled "Select Gate Formation for Nanodot Flat Cell," the entire contents of which are incorporated herein by reference. Specifically, the hybrid floating gate described in one or more of the above-described embodiments may be substituted for the floating gate 625 structure of the Ser. No. 13/690,054 application.

The foregoing method descriptions are provided merely as illustrative examples and are not intended to require or imply that the steps of the various embodiments must be performed in the order presented. As will be appreciated by one of skill in the art the order of steps in the foregoing embodiments may be performed in any order. Words such as "thereafter," "then," "next," etc. are not necessarily intended to limit the order of the steps; these words may be used to guide the reader through the description of the methods. Further, any reference to claim elements in the singular, for example, using the articles "a," "an" or "the" is not to be construed as limiting the element to the singular.

The preceding description of the disclosed aspects is provided to enable any person skilled in the art to make or use the present invention. Various modifications to these aspects will be readily apparent to those skilled in the art, and the generic principles defined herein may be applied to other aspects without departing from the scope of the invention. Thus, the present invention is not intended to be limited to the aspects shown herein but is to be accorded the widest scope consistent with the principles and novel features disclosed herein.

What is claimed is:

1. A method of fabricating a memory device, comprising:
   forming a tunnel dielectric layer over a semiconductor channel;
   forming a floating gate over the tunnel dielectric layer, the floating gate comprising a continous layer of an electrically conductive material and at least one protrusion of an electrically conductive material facing the tunnel dielectric layer and electrically shorted to the continous layer;
   forming a blocking dielectric region over the floating gate;
   forming a control gate over the blocking dielectric layer; and
   further comprising removing at least one nanodot located at least partially under corner regions of the continuous layer;
   wherein the at least one protrusion comprises a plurality of protrusions; and
   wherein the step of removing comprises:
      forming a mask pattern over a stack comprising a tunnel dielectric layer, a plurality of nanodots, the continuous layer, a blocking dielectric layer and a control gate layer; and
      etching portions of the stack that are exposed by the mask pattern to pattern the control gate layer into the control gate, pattern the blocking dielectric layer into the blocking dielectric region, pattern the continuous layer into a floating gate, and remove the nanodots which are located at least partially under the corner regions of the continuous layer and the nanodots which are completely exposed by the mask pattern.

2. The method of claim 1, wherein forming the floating gate layer comprises:
   depositing at least one nanodot over the tunnel dielectric layer to form the at least one protrusion; and
   forming the continous layer over the at least one nanodot.

3. The method of claim 2, wherein the continous layer is formed such that it electrically contacts the at least one nanodot.

4. The method of claim 2, further comprising forming a dielectric layer over the nanodots prior to forming the continuous layer, wherein the dielectric layer allows direct electronic tunneling between the at least one protrusion and the continuous layer.

5. The method of claim 4, wherein the dielectric layer comprises $SiO_2$ and is formed such that the continuous layer is separated from the at least one nanodot by less than 2 nm.

6. The method of claim 1, further comprising:
   forming a dielectric material over the nanodots such that the nanodots are completely embedded in the dielectric material; and
   planarizing the dielectric material so that the nanodots are covered by less than 2 nm of dielectric material or exposed through the dielectric material prior to forming the continuous layer such that the continuous layer is located over the nanodots and dielectric material.

7. The method of claim 1, wherein the at least one protrusion and the continuous layer are formed of the same material.

8. The method of claim 1, wherein the at least one protrusion is formed of a first material and the continous layer is formed of a second material, different than the first material.

9. The method of claim 8, wherein the at least one protrusion is formed of a metal material, and the continuous layer is formed of a different metal material or a highly-doped semiconductor material.

10. The method of claim 1, wherein the memory device comprises a NAND device.

* * * * *